United States Patent [19]
Ema

[11] Patent Number: 5,438,008
[45] Date of Patent: Aug. 1, 1995

[54] METHOD OF MAKING A SEMICONDUCTOR DEVICE HAVING TWO TRANSISTORS FORMING A MEMORY CELL AND A PERIPHERAL CIRCUIT, WHEREIN THE IMPURITY REGION OF THE FIRST TRANSISTOR IS NOT SUBJECTED TO AN ETCHING ATMOSPHERE

[75] Inventor: Taiji Ema, Kawasaki, Japan

[73] Assignee: Fujitsu Limited, Kanagawa, Japan

[21] Appl. No.: 149,345

[22] Filed: Nov. 9, 1993

Related U.S. Application Data

[60] Division of Ser. No. 956,479, Oct. 2, 1992, Pat. No. 5,286,998, which is a continuation of Ser. No. 528,392, May 25, 1990, abandoned.

[30] Foreign Application Priority Data

May 31, 1989 [JP] Japan .................................. 1-137861

[51] Int. Cl.⁶ .......................................... H01L 21/265
[52] U.S. Cl. .................................. 437/41; 437/29; 437/44; 437/52; 437/919
[58] Field of Search ............... 437/29, 34, 919, 41, 437/52, 44

[56] References Cited

U.S. PATENT DOCUMENTS 4,760,033  7/1988  Mueller ................................ 437/34
4,874,713 10/1989  Gioia .................................... 437/34

*Primary Examiner*—Olik Chaudhuri
*Assistant Examiner*—H. Jey Tsai
*Attorney, Agent, or Firm*—Armstrong, Westerman, Hattori, McLeland & Naughton

[57] ABSTRACT

A semiconductor device includes a semiconductor substrate, a first transistor formed on the semiconductor substrate and having a first source diffusion region, a first drain diffusion region and a first gate electrode, a second transistor formed on the semiconductor substrate adjacent to the first transistor and having a second source diffusion region, a second drain diffusion region and a second gate electrode, a field oxide layer formed on the semiconductor substrate for isolating the first and second transistors, a first insulator layer which covers a surface of the semiconductor substrate including a surface of the first transistor but excluding a surface of the second transistor, where the first insulator layer has a side wall portion, and a second insulator layer formed at the side wall portion of the first insulator layer and a side wall portion of the second gate electrode of the second transistor.

9 Claims, 13 Drawing Sheets

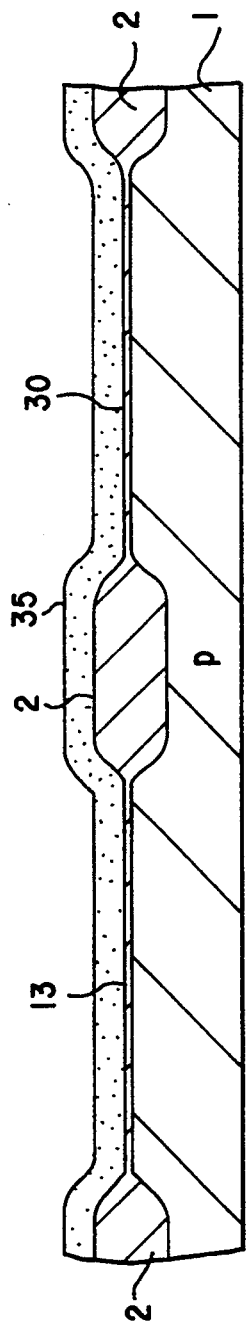
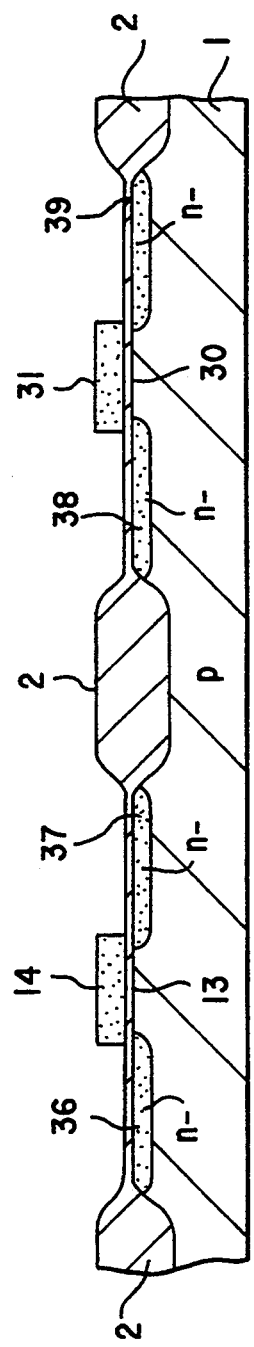
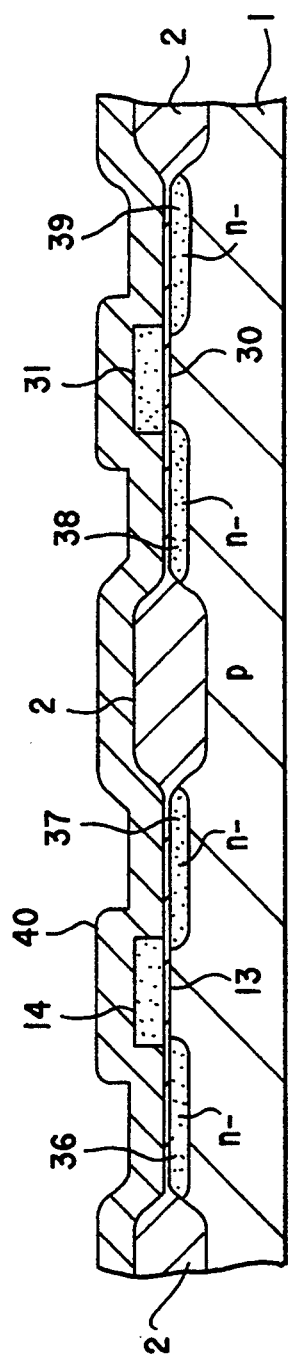
FIG.1A PRIOR ART
FIG.1B PRIOR ART
FIG.1C PRIOR ART

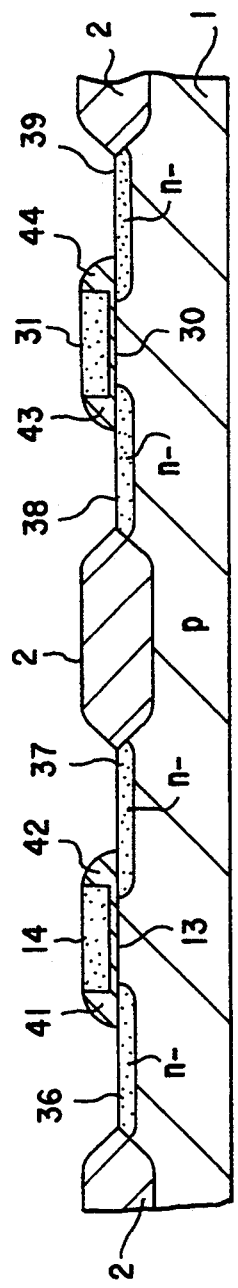
FIG.ID
PRIOR ART
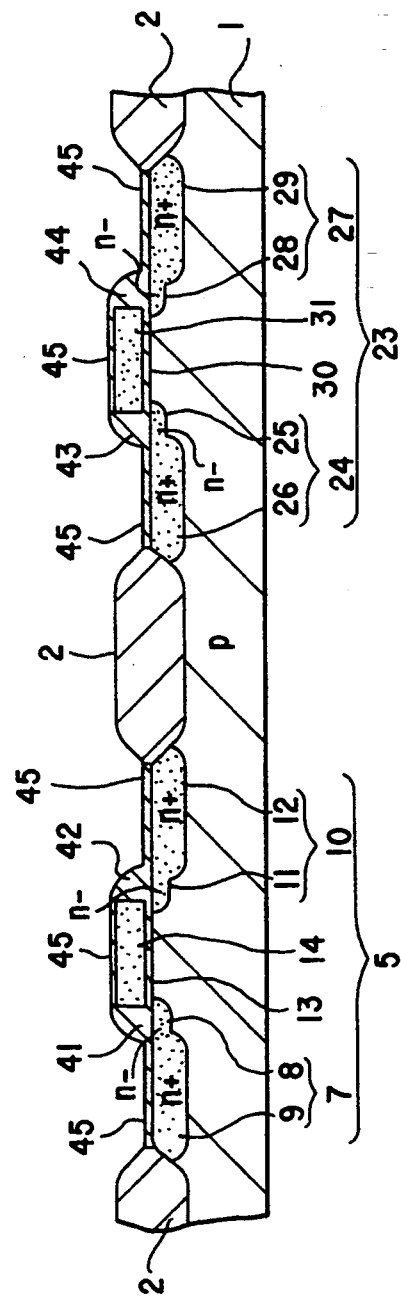
FIG.IE
PRIOR ART
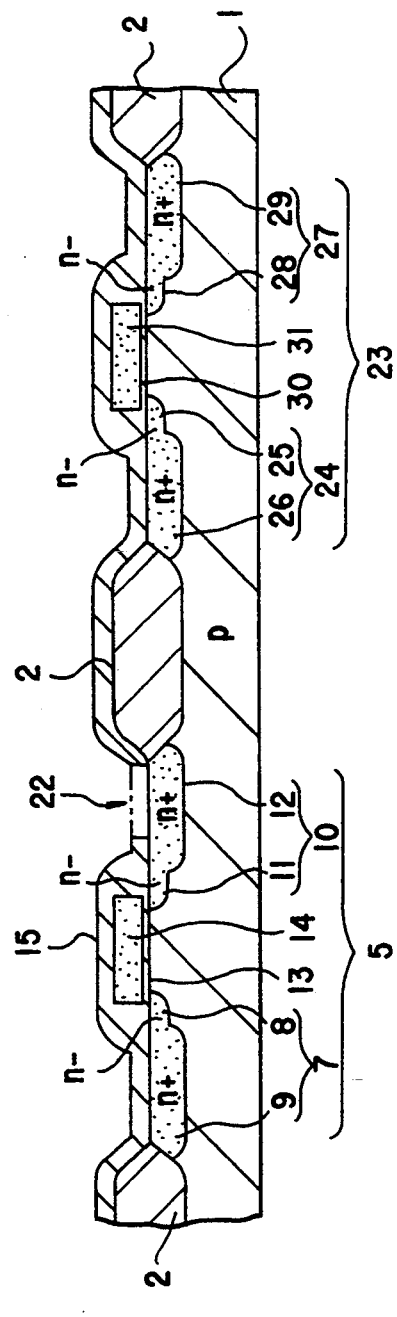
FIG.IF
PRIOR ART

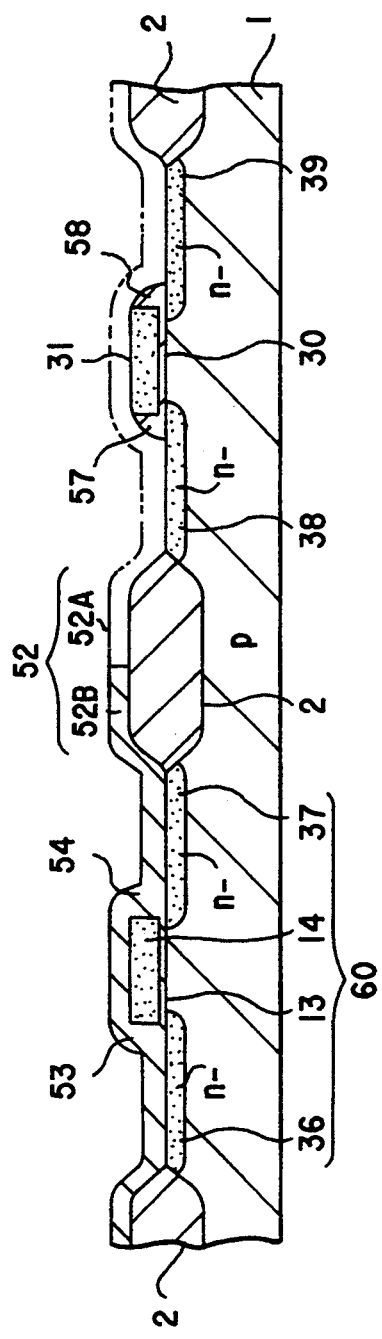
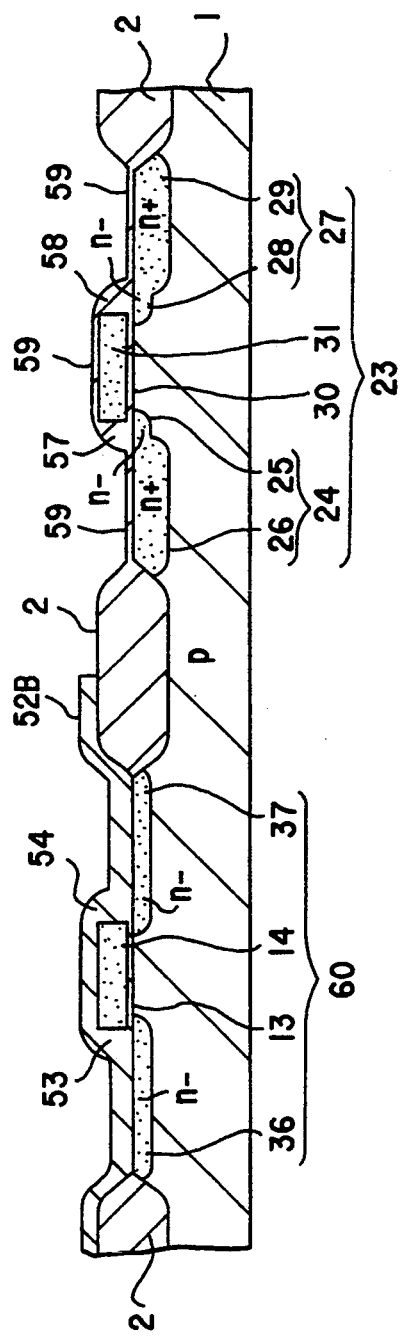
FIG.5A
FIG.5B

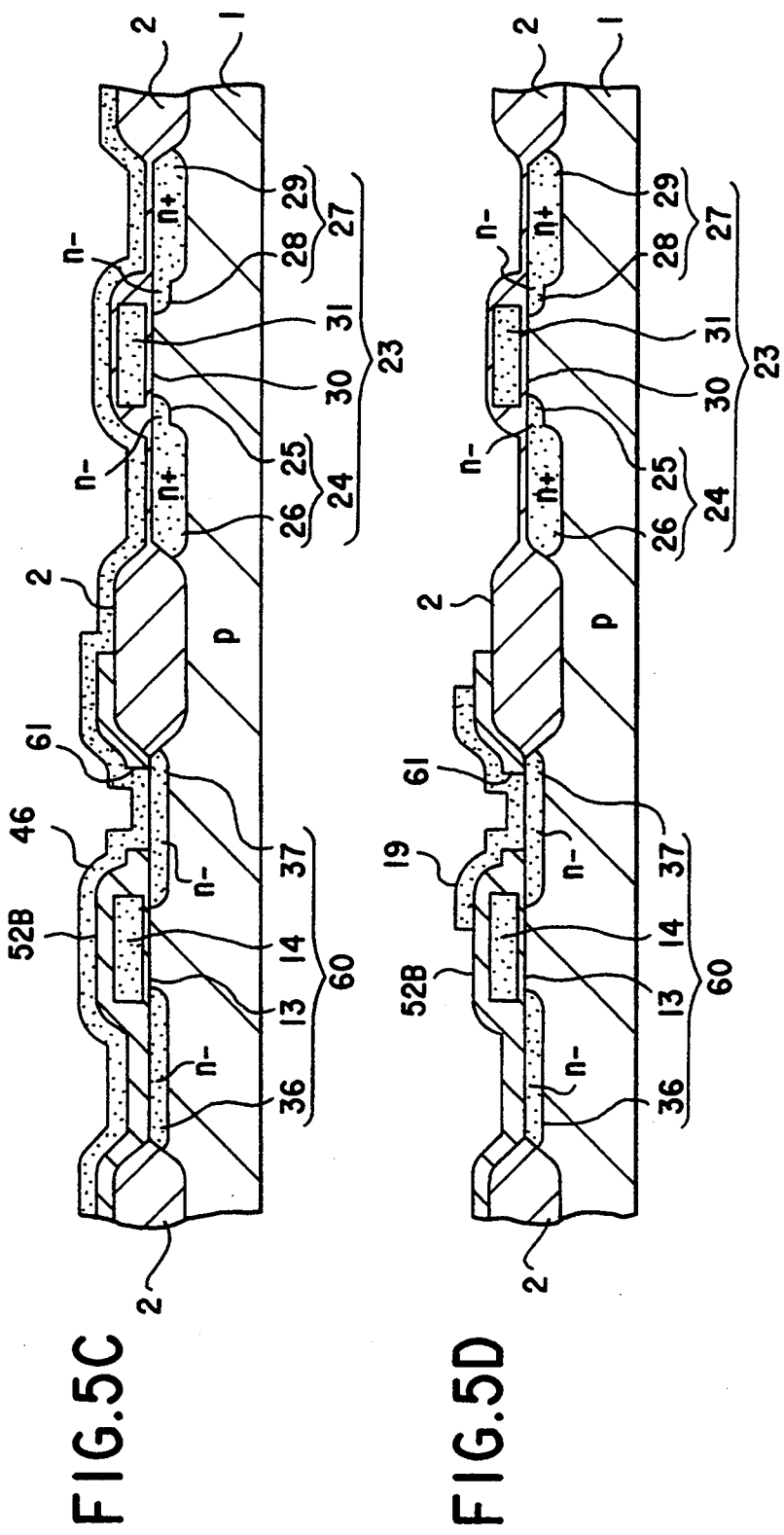

METHOD OF MAKING A SEMICONDUCTOR DEVICE HAVING TWO TRANSISTORS FORMING A MEMORY CELL AND A PERIPHERAL CIRCUIT, WHEREIN THE IMPURITY REGION OF THE FIRST TRANSISTOR IS NOT SUBJECTED TO AN ETCHING ATMOSPHERE

This is a division of application Ser. No. 07/956,479, filed Oct. 2, 1992, U.S. Pat. No. 5,286,998 which is a continuation of 07/528,392, filed May 25, 1990, now abandoned.

BACKGROUND OF THE INVENTION

The present invention generally relates to semiconductor devices and production methods thereof, and more particularly to a semiconductor device having first and second transistors and a production method thereof, where there are three demands on the first and second transistors. First, there is a demand to suppress generation of crystal defect in the first transistor by not subjecting an impurity diffusion layer of the first transistor to an etching. Second, there is a demand to form a conductor layer on the first transistor via an insulator layer. Third, there is a demand to obtain a satisfactory current driving capability for the second transistor.

For example, in a dynamic random access memory (DRAM) which is provided with stacked capacitors, there are demands to simultaneously satisfy three conditions in order to improve the charge storage characteristic of memory cells. A first condition is not to subject an impurity diffusion layer of a transistor which makes up the memory cell so as to suppress the generation of crystal defect. A second condition is to facilitate the formation of a storage electrode by flattening a layer below the storage electrode. A third condition is to ensure a satisfactory current driving capability of the transistor of a peripheral circuit.

Conventionally, there is a DRAM provided with stacked capacitors as shown in FIG. 1K which shows a cross section of an essential part of this conventional DRAM. The DRAM includes a p-type silicon (Si) substrate 1, a field oxide layer 2 which forms a device isolation region, a memory cell 3, and a peripheral circuit 4.

The memory cell 3 is made up of an n-channel insulated-gate type field effect transistor (hereinafter simply referred to as an nMOS FET) 5 which forms a transistor for controlling input/output of charge, and a stacked capacitor 6. The nMOS FET 5 has a lightly doped drain (LDD) structure. A source diffusion layer 7 of the nMOS FET 5 is made up of an $n^-$-type source diffusion layer 8 and an $n^+$-type source diffusion layer 9. A drain diffusion layer 10 of the nMOS FET 5 is made up of an $n^-$-type drain diffusion layer 11 and an $n^+$-type drain diffusion layer 12.

A gate insulator layer 13 is made of silicon dioxide ($SiO_2$), a gate electrode (word line) 14 is made of polysilicon, an interlayer insulator 15 is made of $SiO_2$, an interlayer insulator 16 is made of phospho-silicate glass (PSG), and a bit line 17 is made of aluminum (Al). The bit line 17 makes an ohmic contact with the $n^+$-type source diffusion layer 9 via a contact hole 18.

The stacked capacitor 6 is made up of a stacked structure including a polysilicon storage electrode 19, a $SiO_2$ capacitor insulator layer 20 and a polysilicon confronting electrode 21. The storage electrode 19 makes an ohmic contact with the $n^+$-type drain diffusion layer 12 via a contact hole 22.

The peripheral circuit 4 is made up of an nMOS FET 23 which also has the LDD structure. A source diffusion layer 24 of the nMOS FET 23 is made up of an $n^-$-type source diffusion layer 25 and an $n^+$-type source diffusion layer 26. On the other hand, a drain diffusion layer 27 of the nMOS FET 23 is made up of an $n^-$-type drain diffusion layer 28 and an $n^+$-type drain diffusion layer 29.

A gate insulator layer 30 is made of $SiO_2$, a gate electrode 31 is made of polysilicon, and an interconnection 32 is made of Al. The interconnection 32 makes an ohmic contact with the $n^+$-type drain diffusion layer 29 via a contact hole 33.

In addition, the bit line 17 makes an ohmic contact with the $n^+$-type source diffusion layer 26 via a contact hole 34.

This conventional DRAM is produced in a sequence shown in FIGS. 1A through 1K.

First, the p-type Si substrate 1 is prepared as shown in FIG. 1A. A surface of this p-type Si substrate 1 is selectively oxidized to form the field oxide layer 2 which has a thickness of 5000 Å, for example. Then, the $SiO_2$ layers 13 and 30 are formed in a device region by a thermal oxidation to a thickness of 150 Å, for example. Furthermore, a polysilicon layer 35 having a thickness of 2000 Å, for example, is formed on the entire surface of the stacked structure by a chemical vapor deposition (CVD).

Next, the polysilicon layer 35 is patterned, and as shown in FIG. 1B, the gate electrodes 14 and 31 are formed. Then, the gate electrodes 14 and 31 and the field oxide layer 2 are used as a mask when implanting phosphorous (P) ions into the p-type Si substrate 1 with an energy of 50 keV and a dosage of $1 \times 10^{13}$ cm$^{-2}$, for example. As a result, $n^-$-type diffusion layers 36 and 37 are formed.

Thereafter, as shown in FIG. 1C, a $SiO_2$ layer 40 having a thickness of 3000 Å, for example, is formed on the entire surface of the stacked structure by a CVD. A reactive ion etching (RIE) is made with respect to the $SiO_2$ layer 40 and the $SiO_2$ layers 13 and 30 under the $SiO_2$ layer 40, so as to partially expose the $n^-$-type diffusion layers 36, 37, 38 and 39 as shown in FIG. 1D. In this state, so-called side wall $SiO_2$ layers 41, 42, 43 and 44 are formed on the side wall portions of the gate electrodes 14 and 31.

Next, a thermal oxidation is made to form a $SiO_2$ layer 45 which has a thickness of 150 Å, for example, on the exposed surfaces of the p-type Si substrate 1 and the gate electrodes 14 and 31 as shown in FIG. 1E. Thereafter, the gate electrodes 14 and 31, the side wall $SiO_2$ layers 41, 42, 43 and 44 and the field oxide layer 2 are used as a mask when implanting arsenide (As) ions into the p-type Si substrate 1 with an energy of 50 keV and a dosage of $4 \times 10^{15}$ cm$^{-2}$, for example. As a result, the nMOS FET 5 and the nMOS FET 23 are formed. The nMOS FET 5 has the source diffusion layer 7 which is made up of the $n^-$-type source diffusion layer 8 and the $n^+$-type source diffusion layer 9, and the drain diffusion layer 10 which is made up of the $n^-$-type drain diffusion layer 11 and the $n^+$-type drain diffusion layer 12. Similarly, the nMOS FET 23 has the source diffusion layer 24 which is made up of the $n^-$-type source diffusion layer 25 and the $n^+$-type source diffusion layer 26, and the drain diffusion layer 27 which is made up of the n⁻-type drain diffusion layer 28 and the n⁺-type drain diffusion layer 29.

Then, as shown in FIG. 1F, a SiO$_2$ layer having a thickness of 1000 Å, for example, is formed on the entire surface of the stacked structure by a CVD so as to form the interlayer insulator 15 which is made of SiO$_2$. The contact hole 22 which has a width of 0.8 μm, for example, is formed in the interlayer insulator 15 above the n⁺-type drain diffusion layer 12.

Next, as shown in FIG. 1G, a polysilicon layer 46 having a thickness of 2000 Å, for example, is formed on the entire surface of the stacked structure. As ions are implanted into this polysilicon layer 46 with an energy of 50 keV and a dosage of $1 \times 10^{15}$ cm$^{-2}$, for example, so as to reduce the resistance. The polysilicon layer 46 is then patterned as shown in FIG. 1H, and the storage electrode 19 which makes an ohmic contact with the n⁺-type drain diffusion layer 12 via the contact hole 22 is formed.

Thereafter, an oxide layer which is naturally formed on the exposed surface of the storage electrode 19 is removed by an etching using a hydrogen fluoride (HF) solution. Further, a thermal oxidation is carried out to form a SiO$_2$ capacitor insulator layer 20 which has a thickness of 100 Å, for example, on the exposed surface of the storage electrode 19 as shown in FIG. 1I.

Next, a polysilicon layer 47 having a thickness of 2000 Å, for example, is formed on the entire surface of the stacked structure as shown in FIG. 1J, and P is thermally diffused into the polysilicon layer 47 to reduce the resistance. Thereafter, this polysilicon layer 47 is patterned to form the confronting electrode 21 as shown in FIG. 1K.

Then, the PSG layer 16 is formed on the entire surface of the stacked structure to a thickness of 5000 Å, for example, as shown in FIG. 1K. The contact holes 18, 33 and 34 are formed in the PSG layer 16, and the bit line 17 and the other interconnection 32 are formed. As a result, the conventional DRAM having the stacked capacitor 6 is obtained.

According to the conventional method of producing the DRAM shown in FIG. 1K, the side wall SiO$_2$ layers 41 and 42 are formed on the side wall portions of the gate electrode 14 as shown in FIG. 1D in order to realize the LDD structure of the nMOS FETs 5 and 23. The side wall SiO$_2$ layers 41 and 42 flatten the vertical stepped portions at the side wall portions of the gate electrode 14, and have a function of facilitating the formation of the storage electrode 19.

FIGS. 2A through 2C are cross sectional views and FIG. 3 is a plan view for explaining the side wall SiO$_2$ layers 41 and 42. For the sake of convenience, a consideration will be given of a case where the storage electrode 19 is formed without forming the side wall SiO$_2$ layers 41 and 42 at the side wall portions of the gate electrode 14.

In this case, a SiO$_2$ layer 48 which covers the gate electrode 14 and the n⁻-type diffusion layers 36 and 37 are first formed as shown in FIG. 2A. After forming a contact hole 49 in the SiO$_2$ layer 48, the polysilicon layer 46 is formed on the entire surface of the stacked structure. Then, after the resistance of this polysilicon layer 46 is reduced by carrying out an ion implantation with respect to the polysilicon layer 46, an RIE is carried out and the polysilicon layer 46 is patterned to form the storage electrode 19 as shown in FIG. 2B.

However, side wall portions 48A and 48B of the SiO$_2$ layer 48 along the gate electrode 14 are formed vertically in accordance with the shape of the side wall portions of the gate electrode 14. For this reason, when the polysilicon layer 46 is etched by the RIE and the storage electrode 19 is formed as shown in FIG. 2B, polysilicon 50 and 51 remain at the side wall portions 48A and 48B of the SiO$_2$ layer 48 as shown in FIGS. 2C and 3. For example, there is a problem in that the polysilicon 50 may extend across two mutually adjacent storage electrodes 19 and short-circuit these storage electrodes 19. On the other hand, there is a problem in that the polysilicon 51 may come off during a subsequent process and adhere across two mutually adjacent storage electrodes 19 and short-circuit these storage electrodes 9.

The side wall portions of the gate electrode 14 may be formed as overhangs. In this case, the side wall portions 48A and 48B of the SiO$_2$ layer 48 are also formed as overhangs. For this reason, when the RIE is carried out with respect to the polysilicon layer 46 and the storage electrode 19 is formed, polysilicon inevitably remains at the side wall portions 48A and 48B. When the side wall portions of the gate electrode 14 are formed as overhangs, the above described problems become particularly notable.

Accordingly, in the conventional DRAM, the side wall SiO$_2$ layers 41 and 42 are formed at the side wall portions of the gate electrode 14 as shown in FIG. 1D and the vertical stepped portions at the side wall portions of the gate electrode 14 are flattened so as to facilitate the formation of the storage electrode 19.

However, the conventional DRAM described above suffer from the following problems.

First, when forming the side wall SiO$_2$ layers 41, 42, 43 and 44 by the RIE as shown in FIG. 1D, the surface of the n⁻-type diffusion layer 37 is subjected to the plasma atmosphere. As a result, there is a problem in that a crystal defect is generated at the surface of the n⁻-type diffusion layer 37 due to contamination of metals such as iron, copper and nickel which are included in the internal wall of a chamber containing the plasma or included in the plasma atmosphere caused by electrode erosion. Because the storage electrode 19 is connected to the surface of the n⁻-type diffusion layer 37, the charge storage characteristic (refresh characteristic) of the memory cell 3 is deteriorated by the crystal defect.

Hence, a description will be given of a conceivable method of producing the DRAM to eliminate the problem of the conventional method, by referring to FIG. 4. According to this conceivable method, when etching by the RIE the SiO$_2$ layer 40 which is formed on the entire surface of the stacked structure in the step shown in FIG. 1C, the etching is ended halfway as shown in FIG. 4. Then, a SiO$_2$ layer 52 having a predetermined thickness is formed, and side wall SiO$_2$ layers 53, 54, 55 and 56 are formed at the side wall portions of the gate electrodes 14 and 31.

According to this conceivable method, it is possible to form the side wall SiO$_2$ layers 53 and 54 at the side wall portions of the gate electrode 14 without subjecting the n⁻-type diffusion layer 37 to the plasma atmosphere. For this reason, it is possible to protect the n⁻-type diffusion layer 37 from metal contamination and easily form the storage electrode 19.

However, a problem occurs according to this conceivable method at a latter stage when the n⁺-type source diffusion layer 9 and the n⁺-type drain diffusion layer 12 of the nMOS FET 5 and the n⁺-type source diffusion layer 26 and the n⁺-type drain diffusion layer 29 of the nMOS FET 23 are formed as shown in FIG. 1E described above.

In other words, when forming the $n^+$-type source diffusion layer 9, the $n^+$-type drain diffusion layer 12, the $n^+$-type source diffusion layer 26 and the $n^+$-type drain diffusion layer 29 according to the conceivable method of FIG. 4, it is necessary to accelerate the As ion implantation into the p-type Si substrate 1 such that the As ions penetrate the $SiO_2$ layer 52. But it is difficult to control the thickness of the $SiO_2$ layer 52 with a high accuracy according to the RIE, and the As ions must be implanted with an energy which takes into consideration the thickness distribution of the $SiO_2$ layer 52. Hence, when the As ion implantation is carried out under such consideration, the As ions penetrate the gate electrodes 14 and 31 and reach the channel region, thereby introducing undesirable effects on the characteristics of the nMOS FETs 5 and 23.

On the other hand, there is another problem in that the ion implantation with a high acceleration and a high dosage leads to a poor throughput.

Second, the conventional DRAM shown in FIG. 1K has the $n^+$-type drain diffusion layer 12 provided in the nMOS FET 5, but the As ion implantation with respect to the p-type Si substrate 1 must be carried out with a high dosage in order to form this $n^+$-type drain diffusion layer 12. In this case, the region which is subjected to the As ion implantation is transformed into an amorphous state, and it becomes necessary to thereafter carry out a thermal process to transform the region back into a crystal state. But when such a recrystallization is carried out, a dislocation loop is generated in the $n^+$-type drain diffusion layer 12 and there is a problem in that the charge storage characteristic of the memory cell 3 is deteriorated thereby.

In addition, in the conventional DRAM shown in FIG. 1K, the tip end of the side wall $SiO_2$ layer 42 makes direct contact with the p-type Si substrate 1 as shown in FIG. 1D, and an angle the tip end of the side wall $SiO_2$ layer 42 makes with respect to the surface of the p-type Si substrate 1 cannot be made small. As a result, there are problems in that a stress is concentrated at the tip end portion of the side wall $SiO_2$ layer 42 and an edge dislocation is generated in the $n^-$-type drain diffusion layer 11 or the $n^+$-type drain diffusion layer 12 about this portion when the $n^+$-type drain diffusion layer 12 is formed (recrystallization takes place), thereby deteriorating the charge storage characteristic of the memory cell 3.

The dislocation loop and the edge dislocation are also generated in the source diffusion layer 7. However, since the source diffusion layer 7 passes the charge, the dislocation loop and the edge dislocation in the source diffusion layer 7 essentially do not affect the charge storage characteristic of the memory cell 3.

The transistor which makes up the memory cell merely controls the input/output of the charge. Thus, virtually no problems are generated from the point of view of the operation characteristic of this transistor even when the resistances of the source diffusion layer and the drain diffusion layer thereof are large. Accordingly, it is sufficient to provide only the $n^-$-type source diffusion layer and the $n^-$-type drain diffusion layer with respect to the transistor which makes up the memory cell, and this in effect avoids the generation of the dislocation loop and the edge dislocation in the drain diffusion layer.

On the other hand, the current driving capability must be ensured for the transistor which makes up the peripheral circuit. For this reason, the resistances of the source diffusion layer and the drain diffusion layer of this transistor must be small. As a result, the $n^+$-type source diffusion layer and the $n^+$-type drain diffusion layer must be provided for the transistor which makes up the peripheral circuit.

Therefore, in the conventional DRAM, there is a demand to form the transistor which makes up the memory cell so that a source diffusion layer and a drain diffusion layer thereof are respectively made solely from an $n^-$-type source diffusion layer and an $n^-$-type drain diffusion layer, and to form the transistor which makes up the peripheral circuit so that a source diffusion layer includes an $n^-$-type source diffusion layer and an $n^+$-type source diffusion layer and a drain diffusion layer includes an $n^-$-type drain diffusion layer and an $n^+$-type drain diffusion layer.

SUMMARY OF THE INVENTION

Accordingly, it is a general object of the present invention to provide a novel and useful semiconductor device and production method thereof in which the problems described above are eliminated.

Another and more specific object of the present invention is to provide a semiconductor device comprising a semiconductor substrate, a first transistor formed on the semiconductor substrate and having a first source diffusion region, a first drain diffusion region and a first gate electrode, where the first source diffusion region and the first drain diffusion region are formed in the semiconductor substrate, a second transistor formed on the semiconductor substrate adjacent to the first transistor and having a second source diffusion region, a second drain diffusion region and a second gate electrode, where the second source diffusion region and the second drain diffusion region are formed in the semiconductor substrate, a field oxide layer formed on the semiconductor substrate for isolating the first and second transistors, a first insulator layer which covers a surface of the semiconductor substrate including a surface of the first transistor but excluding a surface of the second transistor, where the first insulator layer has a side wall portion, and a second insulator layer formed at the side wall portion of the first insulator layer and a side wall portion of the second gate electrode of the second transistor. According to the semiconductor device of the present invention, it is possible to suppress the generation of crystal defect by not subjecting the impurity region of the first transistor to an etching atmosphere.

Still another object of the present invention is to provide a method of producing a semiconductor device comprising the steps of forming a first gate of a first transistor and a second gate of a second transistor on a semiconductor substrate which has a field oxide layer for isolating the first and second transistors, forming impurity diffusion regions in the semiconductor substrate to make a first source diffusion region and a first drain diffusion region of the first transistor and a second source diffusion region and a second drain diffusion region of the second transistor, forming a first insulator layer which covers a surface of the semiconductor substrate including a surface of the first transistor but excluding a surface of the second transistor, and forming a second insulator layer which covers exposed surfaces of the semiconductor substrate and the second gate electrode of the second transistor, where the step of forming the first insulator layer includes the substeps of forming the first insulator layer on an entire surface of the semiconductor substrate including the first and second gates and removing the first insulator layer on the second transistor by an anisotropic etching. According to the method of the present invention, it is possible to suppress the generation of crystal defect by not subjecting the impurity region of the first transistor to an etching atmosphere.

A further object of the present invention is to provide a method of producing a semiconductor device comprising the steps of forming a first gate of a first transistor and a second gate of a second transistor on a semiconductor substrate which has a field oxide layer for isolating the first and second transistors, forming impurity diffusion regions in the semiconductor substrate to make a first source diffusion region and a first drain diffusion region of the first transistor and a second source diffusion region and a second drain diffusion region of the second transistor, forming a first insulator layer which covers a surface of the semiconductor substrate including a surface of the first transistor but excluding a surface of the second transistor, forming a second insulator layer which covers the first insulator layer and the surface of the second transistor, and forming a side wall insulation layer at a side wall portion of the first insulator layer and a side wall portion of the second gate electrode of the second transistor by carrying out an anisotropic etching with respect to the second insulator layer. According to the method of the present invention, it is possible to suppress the generation of crystal defect by not subjecting the impurity region of the first transistor to an etching atmosphere.

Other objects and further features of the present invention will be apparent from the following detailed description when read in conjunction with the accompanying drawings.

BRIEF DESCRIPTION OF THE DRAWINGS

FIGS. 1A through 1K are cross sectional views for explaining a conventional method of producing a DRAM;

FIGS. 5A through 5D are cross sectional views for explaining a first embodiment of a method of producing a semiconductor device according to the present invention;

DESCRIPTION OF THE PREFERRED EMBODIMENTS

Figure 1G:
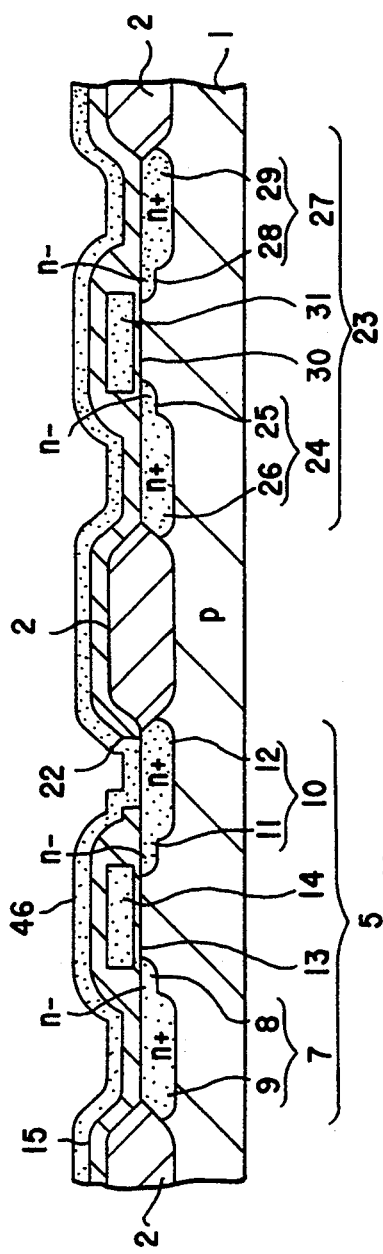
Figure 1H:
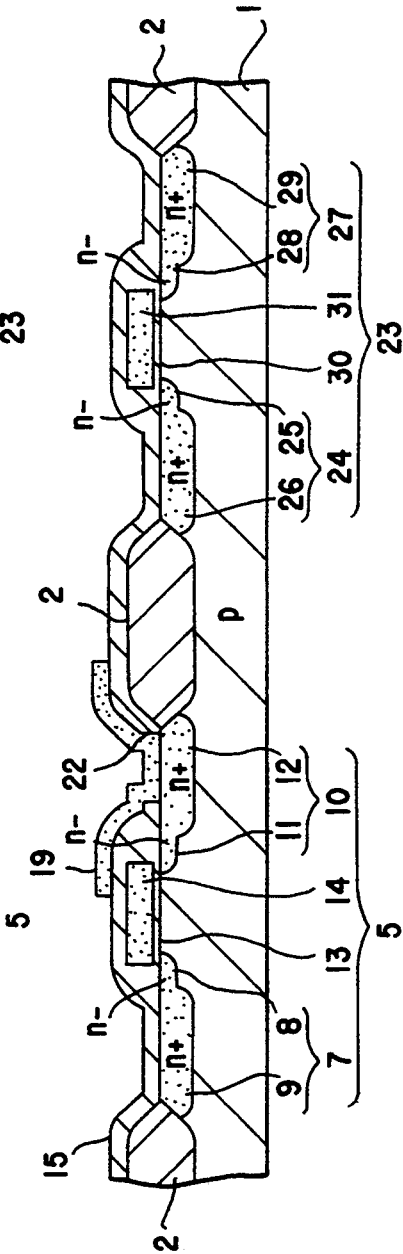
Figure 1I:
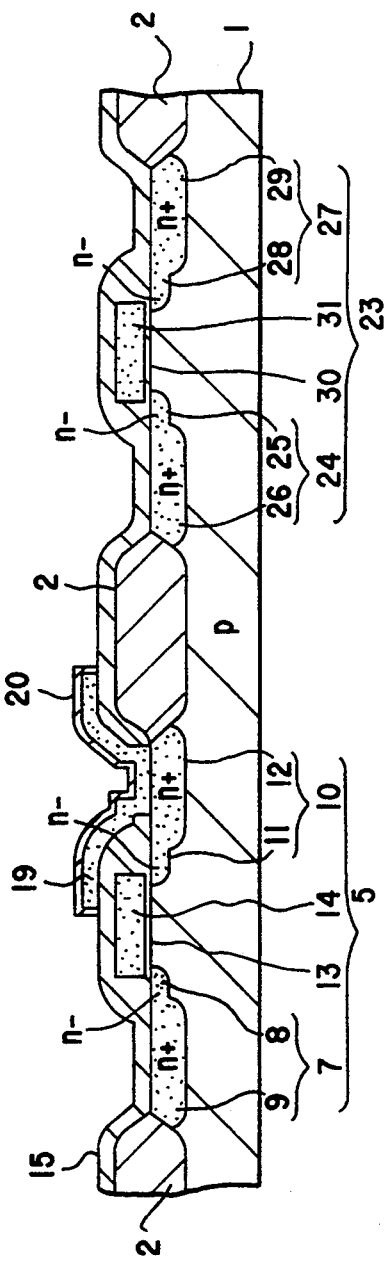
Figure 1J:
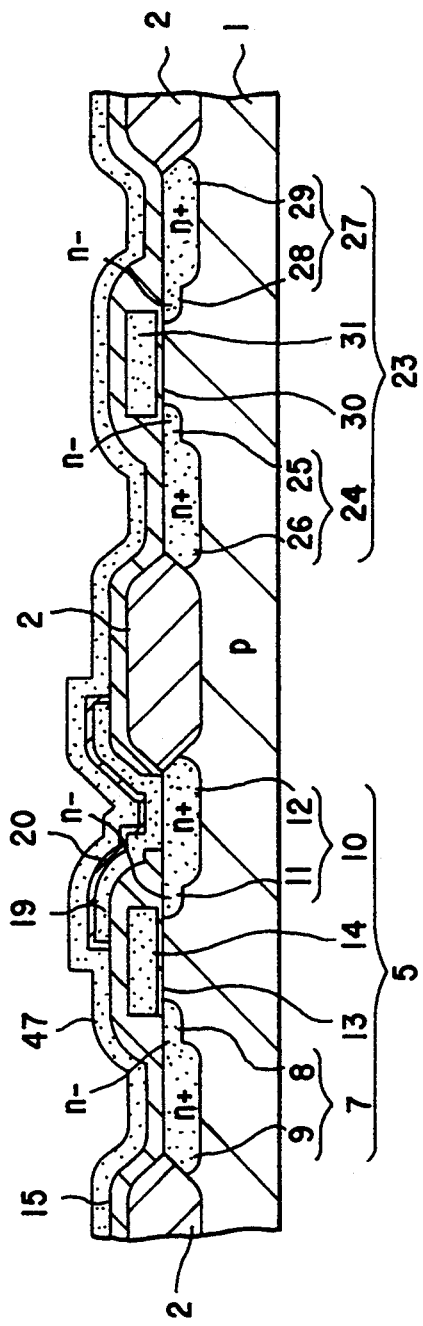
Figure 1K:
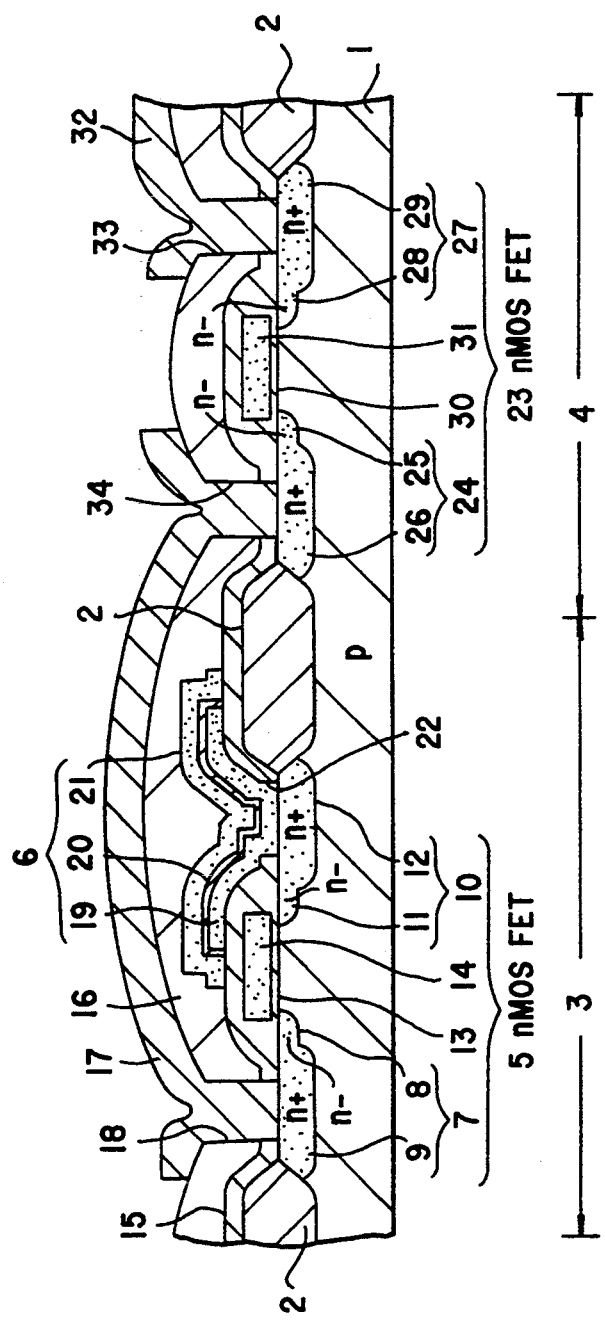
Figure 2A:
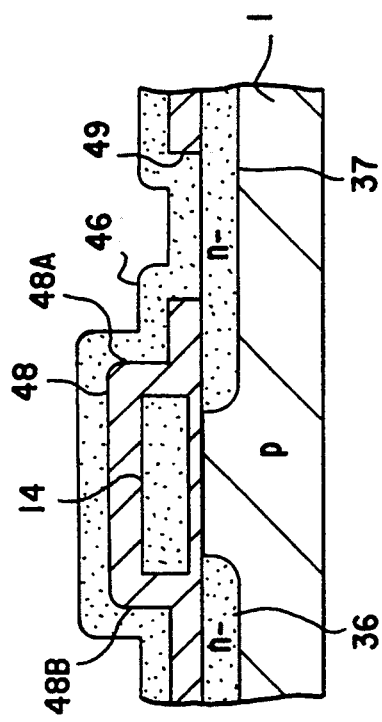
FIGS. 2A through 2C are cross sectional views and FIG. 3 is a plan view respectively showing an essential part of the DRAM shown in FIG. 1K for explaining functions of side wall $SiO_2$ layers which are formed at a gate electrode of an nMOS FET which makes up a memory cell of the DRAM shown in FIG. 1K.
Figure 2B:
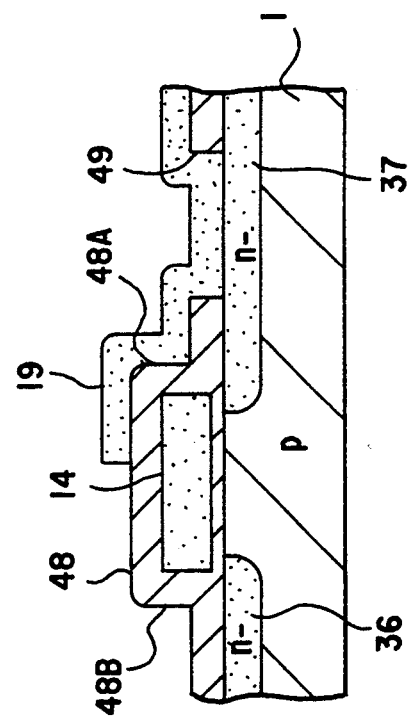
Figure 2C:
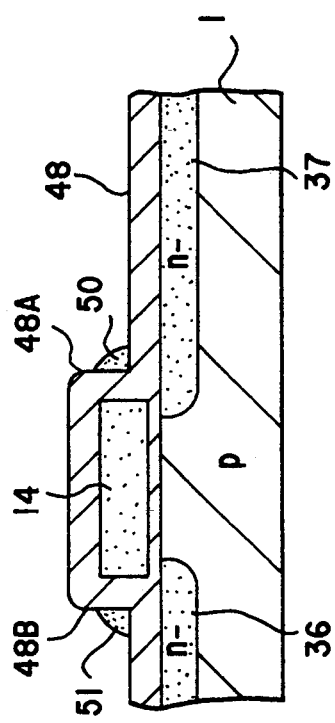
Figure 3:
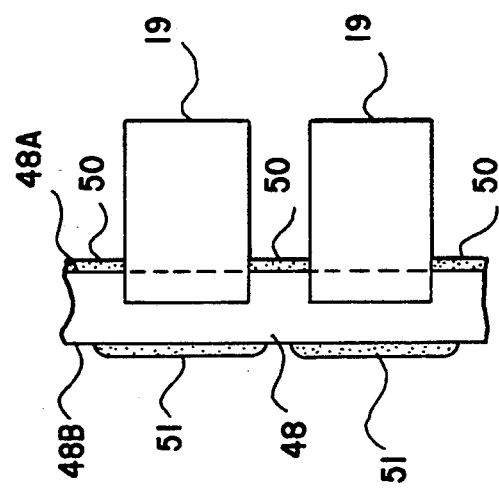

First, a description will be given of a first embodiment of a method of producing a semiconductor device according to the present invention, by referring to FIGS. 5A through 5D. In FIGS. 5A through 5D, those parts which are essentially the same as those corresponding parts in FIGS. 1A through 1K, 2A through 2C, 3 and 4 are designated by the same reference numerals, and a description thereof will be omitted. This embodiment of the method produces a first embodiment of the semiconductor device according to the present invention.

Figure 4:
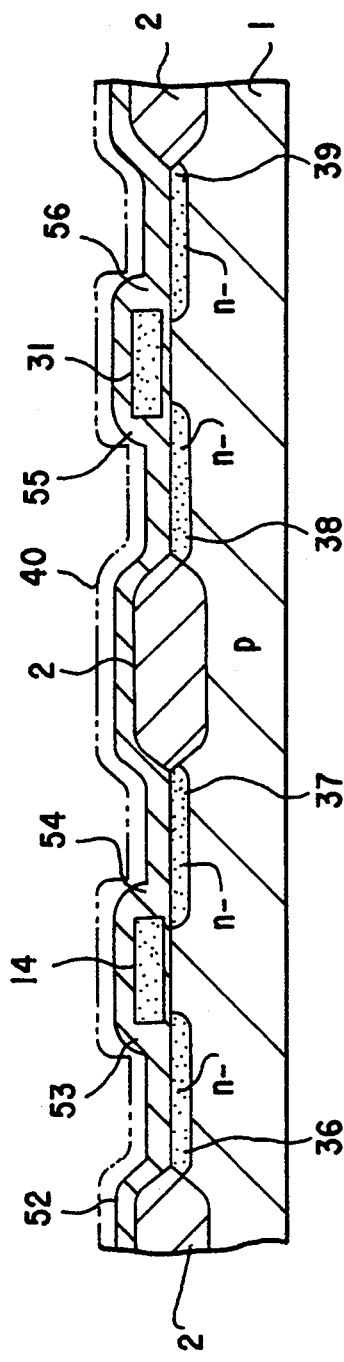
FIG. 4 is a cross sectional view for explaining a conceivable method of producing a DRAM to eliminate the problem of the conventional method.

In this embodiment, the steps described in conjunction with FIGS. 1A through 1C and 4 are carried out to form the $SiO_2$ layer 52 as shown in FIG. 4. Thereafter, as shown in FIG. 5A, a part 52A of the $SiO_2$ layer 52 corresponding to the peripheral circuit is removed by an RIE so that only a part 52B of the $SiO_2$ layer 52 remains. In this case, side wall $SiO_2$ layers 57 and 58 are formed at the side wall portions of the gate electrode 31. In this embodiment, an nMOS FET 60 which uses the $n^-$-type diffusion layer 36 as the $n^-$-type source diffusion layer and the $n^-$-type diffusion layer 37 as the $n^-$-type drain diffusion layer makes up the memory cell 3.

The nMOS FET 23 has the LDD structure, but the nMOS FET 60 does not have the LDD structure because an undesirable current leak is introduced at the pn junction of the LDD structure. Such a current leak is generated due to a surface deterioration caused by the RIE which is carried out with respect to the p-type Si substrate 1. This current leak deteriorates the charge storage characteristic of the memory cell 3, and a transistor having the LDD structure is unsuited for use as the transistor of the memory cell 3. On the other hand, such a current leak is negligible in the case of the transistor which is used for the peripheral circuit 4, as long as a satisfactory current driving capability is ensured. This is the reason why the nMOS FET 23 has the LDD structure while the nMOS FET 60 does not.

Next, a thermal oxidation is carried out to form a $SiO_2$ layer 59 having a thickness of 150 Å, for example, on the exposed surface of the p-type Si substrate 1 and the exposed surface of the gate electrode 31 as shown in FIG. 5B. Then, the part 52B, the field oxide layer 2, the gate electrode 31 and the side wall $SiO_2$ layers 57 and 58 are used as a mask when implanting As ions into the p-type Si substrate 1 with an energy of 50 keV and a dosage of $4 \times 10^{15}$ cm$^{-2}$, for example, so as to form the $n^+$-type source diffusion layer 26 and the $n^+$-type drain diffusion layer 29. Of course, a resist mask may be used in place of the part 52B of the $SiO_2$ layer 52.

As a result, the nMOS FET 23 having the source diffusion layer 24 which is made up of the $n^-$-type source diffusion layer 25 and the $n^+$-type source diffusion layer 26, and the drain diffusion layer 27 which is made up of the $n^-$-type drain diffusion layer 28 and the $n^+$-type drain diffusion layer 29 is formed.

Then, as shown in FIG. 5C, a contact hole 61 is formed in the part 52B above the $n^-$-type drain diffusion layer 37. Thereafter, the polysilicon layer 46 having the thickness of 2000 Å, for example, is formed on the entire surface of the stacked structure, and the resistance of this polysilicon layer 46 is reduced by carrying out an As ion implantation. The storage electrode 19 shown in FIG. 5D is formed by patterning the polysilicon layer 46 by an RIE.

Figure 6:
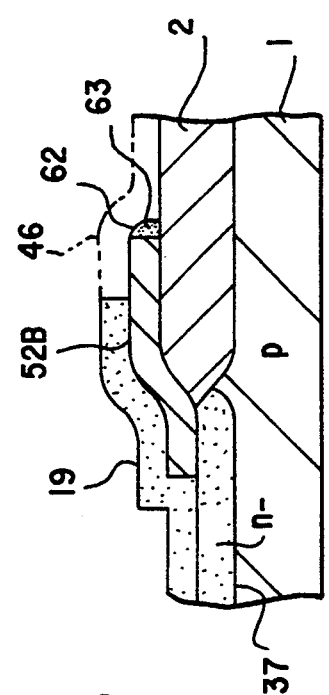
FIG. 6 is a cross sectional view showing a part of the semiconductor device shown in FIG. 5D on an enlarged scale.

The problems of the conventional DRAM are eliminated according to this embodiment. However, as shown in FIG. 6 on an enlarged scale, a side wall portion 62 at the end of the part 52B is formed vertically. Consequently, when the polysilicon layer 46 is etched by the RIE to form the storage electrode 19, polysilicon 63 inevitably remains at the side wall portion 62 of the part 52B. This polysilicon 63 may come off during the subsequent process in which the exposed surface of the storage electrode 19 is naturally oxidized and removed using the HF solution. The polysilicon 63 which comes off may adhere across two mutually adjacent storage electrodes 19 and cause a short-circuit.

Next, a description will be given of a second embodiment of the method of producing the semiconductor device according to the present invention which eliminates the problems of encountered in the first embodiment, by referring to FIGS. 7A through 7K. In FIGS. 7A through 7K, those parts which are essentially the same as those corresponding parts in FIGS. 1A through 1K, 2A through 2C, 3, 4, 5A through 5D and 6 are designated by the same reference numerals, and a description thereof will be omitted. This embodiment of the method produces a second embodiment of the semiconductor device according to the present invention.

Figure 7A:
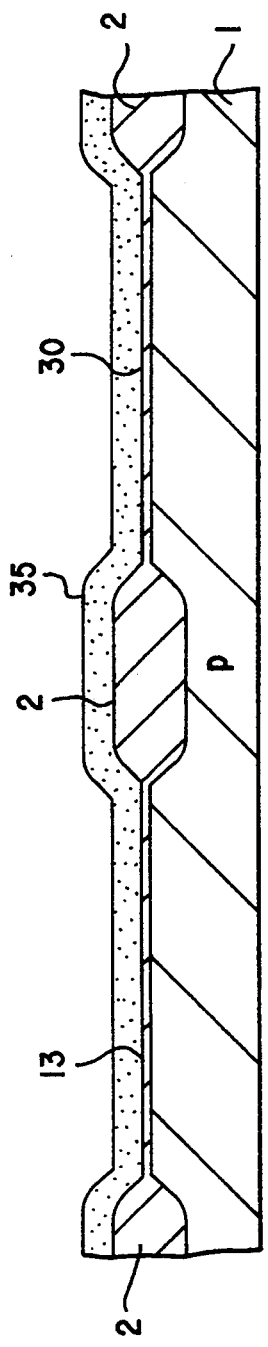
FIGS. 7A through 7K are cross sectional views for explaining a second embodiment of the method of producing a semiconductor device according to the present invention.
Figure 7B:
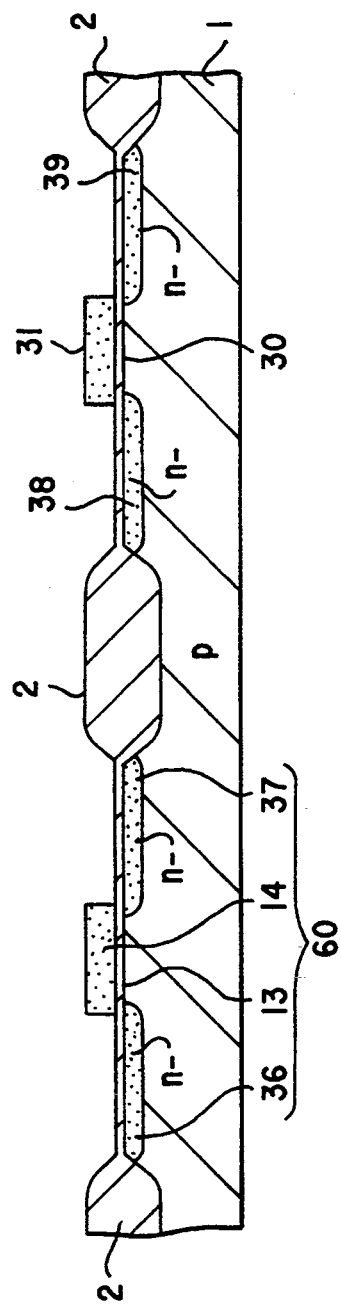

In this embodiment, steps similar to those described in conjunction with FIGS. 1A and 1B are carried out as shown in FIGS. 7A and 7B.

In other words, the p-type Si substrate 1 is prepared as shown in FIG. 7A. The surface of this p-type Si substrate 1 is selectively oxidized to form the field oxide layer 2 which has a thickness of 5000 Å, for example. Then, the SiO$_2$ layers 13 and 30 are formed in the device region by a thermal oxidation to a thickness of 150 Å, for example. Furthermore, the polysilicon layer 35 having a thickness of 2000 Å, for example, is formed on the entire surface of the stacked structure by a CVD.

Next, the polysilicon layer 35 is patterned, and as shown in FIG. 7B, the gate electrodes 14 and 31 are formed. Then, the gate electrodes 14 and 31 are used as a mask when implanting phosphorous (P) ions into the p-type Si substrate 1 with an energy of 50 keV and a dosage of $1 \times 10^{13}$ cm$^{-2}$, for example. As a result, the n$^-$-type diffusion layers 36, 37, 38 and 39 are formed.

In this embodiment, the nMOS FET 60 makes up the memory cell 3, and this nMOS FET 60 uses the n$^-$-type diffusion layer 36 as the n$^-$-type source diffusion layer and the n$^-$-type diffusion layer 37 as the n$^-$-type drain diffusion layer.

Figure 7C:
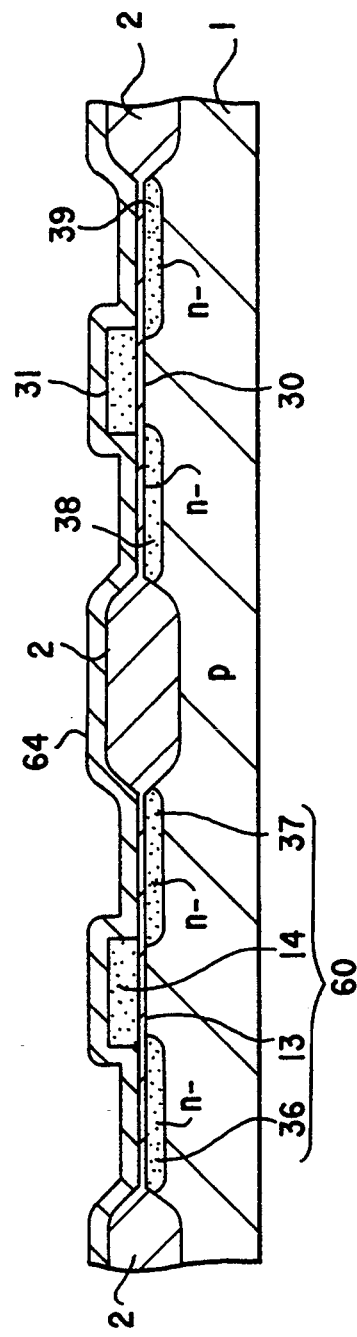
Figure 7D:
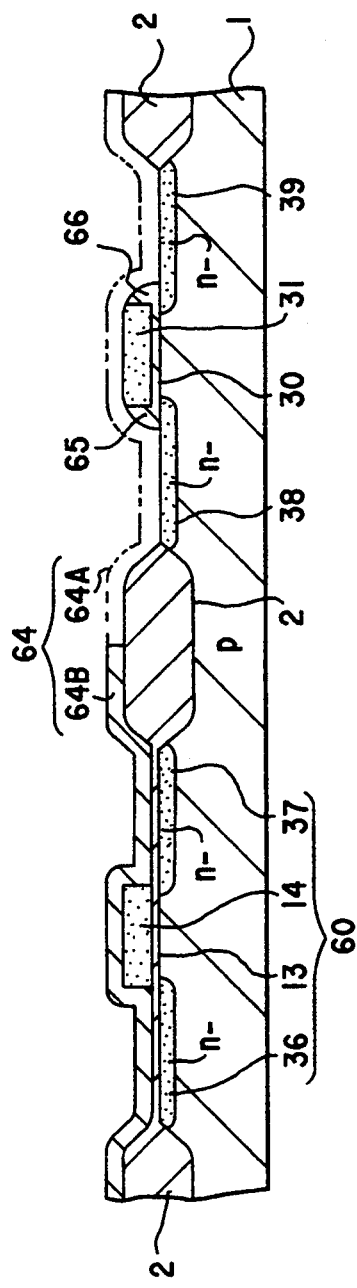

Then, as shown in FIG. 7C, a SiO$_2$ layer 64 having a thickness of 1000 Å, for example, is formed on the entire surface of the stacked structure by a CVD. A part 64A of the SiO$_2$ layer 64 corresponding to the peripheral circuit is removed by an RIE so that only a part 64B of the SiO$_2$ layer 64 corresponding to the memory cell remains as shown in FIG. 7D. The RIE is ended by making an endpoint detection which detects a change in a plasma light emission spectrum intensity when the surface of the p-type Si substrate 1 is exposed at the peripheral circuit. In this case, side wall SiO$_2$ layers 65 and 66 are formed at the side wall portions of the gate electrode 31.

Figure 7E:
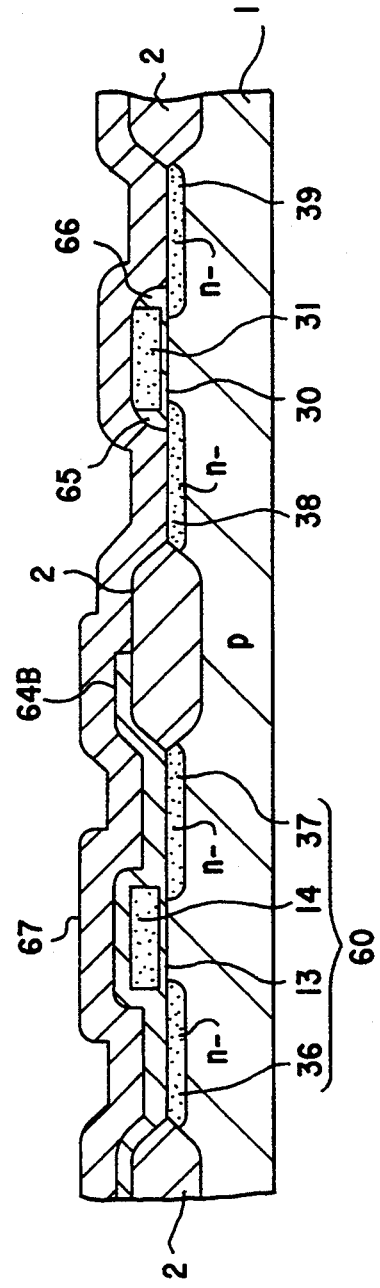
Figure 7F:
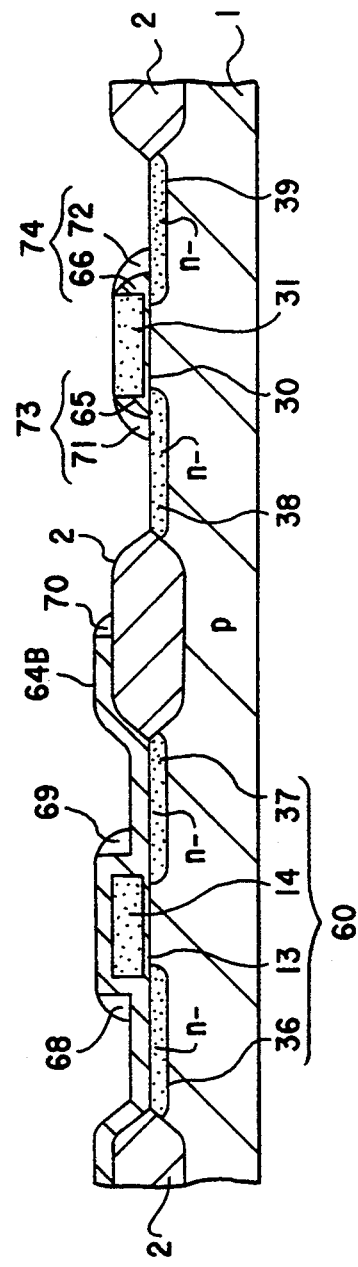
Figure 7G:
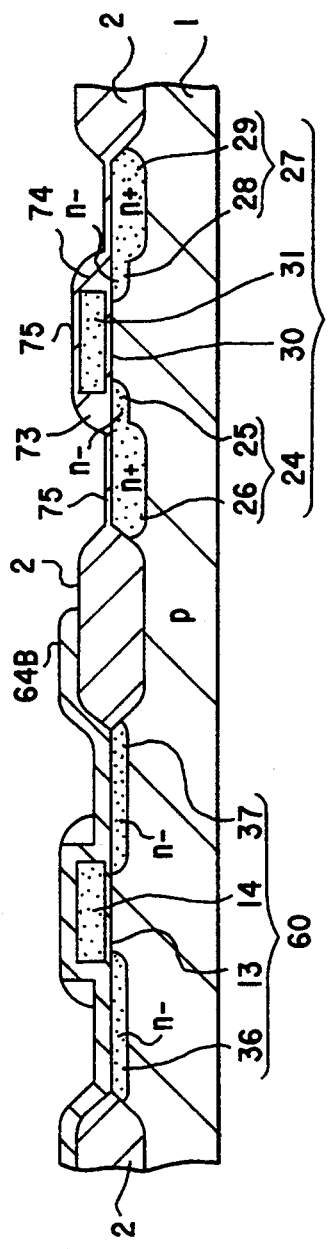

Next, as shown in FIG. 7E, a SiO$_2$ layer 67 having a thickness of 2000 Å, for example, is formed on the entire surface of the stacked structure by a CVD. Thereafter, a RIE is carried out with respect to this SiO$_2$ layer 67 so as to partially expose the n$^-$-type diffusion layers 38 and 39 as shown in FIG. 7F. The endpoint detection described above is also used to detect the end of this RIE. Thus, the surface of the p-type Si substrate 1 at the memory cell will not be subjected to the plasma. Side wall SiO$_2$ layers 68, 69 and 70 are respectively formed at the side wall portions of the part 64B along the gate electrode 14 and at the side wall portion on the end of the part 64B. In addition, side wall SiO$_2$ layers 71 and 72 are respectively formed at the side wall portions of the side wall SiO$_2$ layers 65 and 66. As a result, a side wall SiO$_2$ layer 73 in which the side wall SiO$_2$ layers 65 and 71 are integrated, and a side wall SiO$_2$ layer 74 in which the side wall SiO$_2$ layers 66 and 72 are integrated are formed.

Next, a thermal oxidation is carried out to form a SiO$_2$ layer 75 having a thickness of 150 Å, for example, on the exposed surfaces of the p-type Si substrate 1 and the gate electrode 31. Thereafter, the part 64B of the SiO$_2$ layer 64, the field oxide layer 2, the gate electrode 31 and the side wall SiO$_2$ layers 73 and 74 are used as a mask when implanting As ions into the p-type Si substrate 1 with an energy of 50 keV and a dosage of $4 \times 10^{15}$ cm$^{-2}$, for example, so as to form the source diffusion layer 24 which is made up of the n$^-$-type source diffusion layer 25 and the n$^+$-type source diffusion layer 26 and the drain diffusion layer 27 which is made up of the n$^-$-type drain diffusion layer 28 and the n$^+$-type drain diffusion layer 29. Of course, a resist mask may be used at the memory cell. In addition, an oxidation process may be made after the step shown in FIG. 7D and the As$^+$ ion implantation may be carried out thereafter.

Therefore, the nMOS FET 23 which has the source diffusion layer 24 and the drain diffusion layer 27 is formed.

Figure 7H:
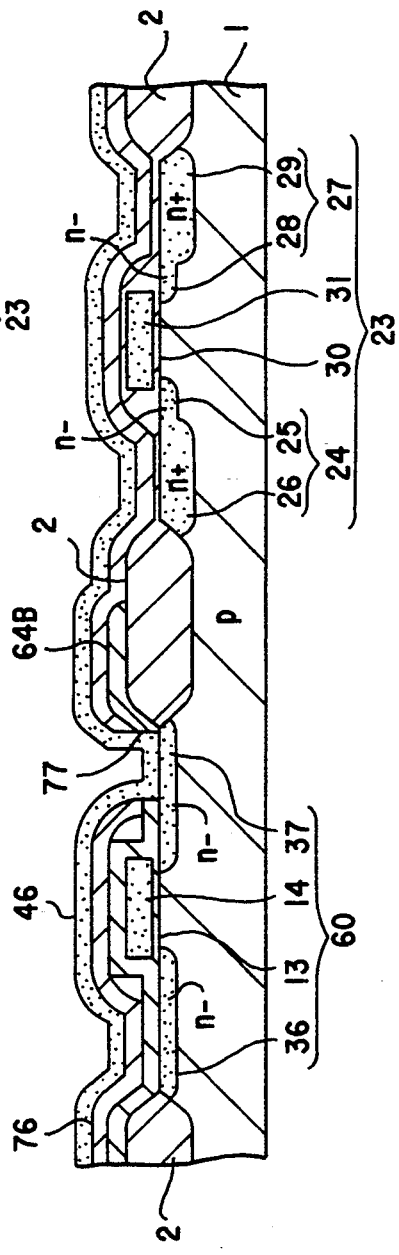

Next, as shown in FIG. 7H, a SiO$_2$ layer 76 having a thickness of 1000 Å, for example, is formed by a CVD. Then, a contact hole 77 is formed in the SiO$_2$ layer 76 and the part 64B of the SiO$_2$ layer 64 above the n$^-$-type source diffusion layer 37. In addition, the polysilicon layer 46 having a thickness of 2000 Å, for example, is formed on the entire surface of the stacked structure. The resistance of this polysilicon layer 46 is reduced by implanting As ions with an energy of 50 keV and a dosage of $1 \times 10^{15}$ cm$^{-2}$, for example.

Figure 7I:
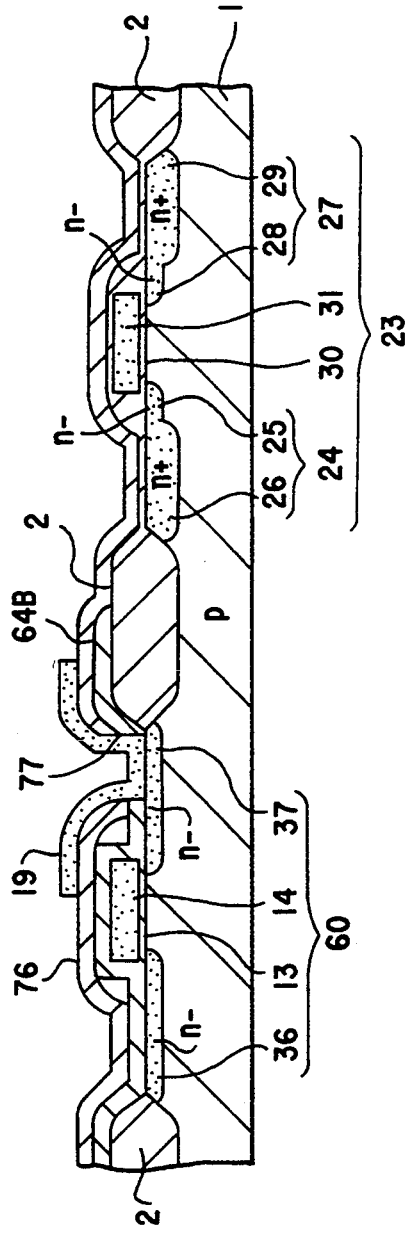

Thereafter, the polysilicon layer 46 is patterned as shown in FIG. 7I, and the storage electrode 19 is formed. This storage electrode 19 makes an ohmic contact with the n$^+$-type drain diffusion layer 11 via the contact hole 77. A natural oxide layer which is formed at the exposed surface of the storage electrode 19 is removed by an etching using the HF solution.

Figure 7J:
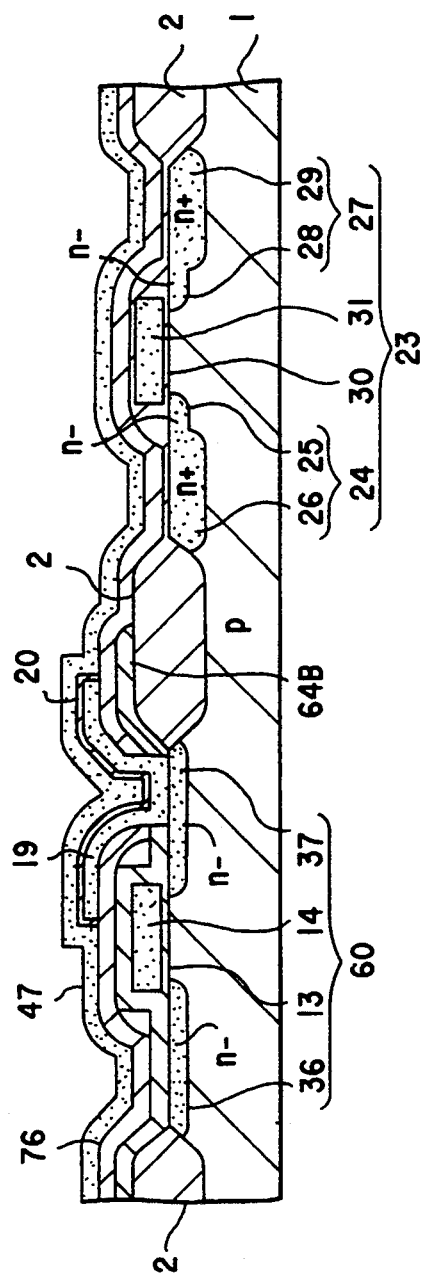

A thermal oxidation is carried out to form the SiO$_2$ capacitor insulator layer 20 which has a thickness of 100 Å, for example, on the exposed surface of the storage electrode 19 as shown in FIG. 7J. The polysilicon layer 47 having a thickness of 2000 Å, for example, is formed on the entire surface of the stacked structure as shown in FIG. 7J, and P is thermally diffused into the polysilicon layer 47 to reduce the resistance.

Figure 7K:
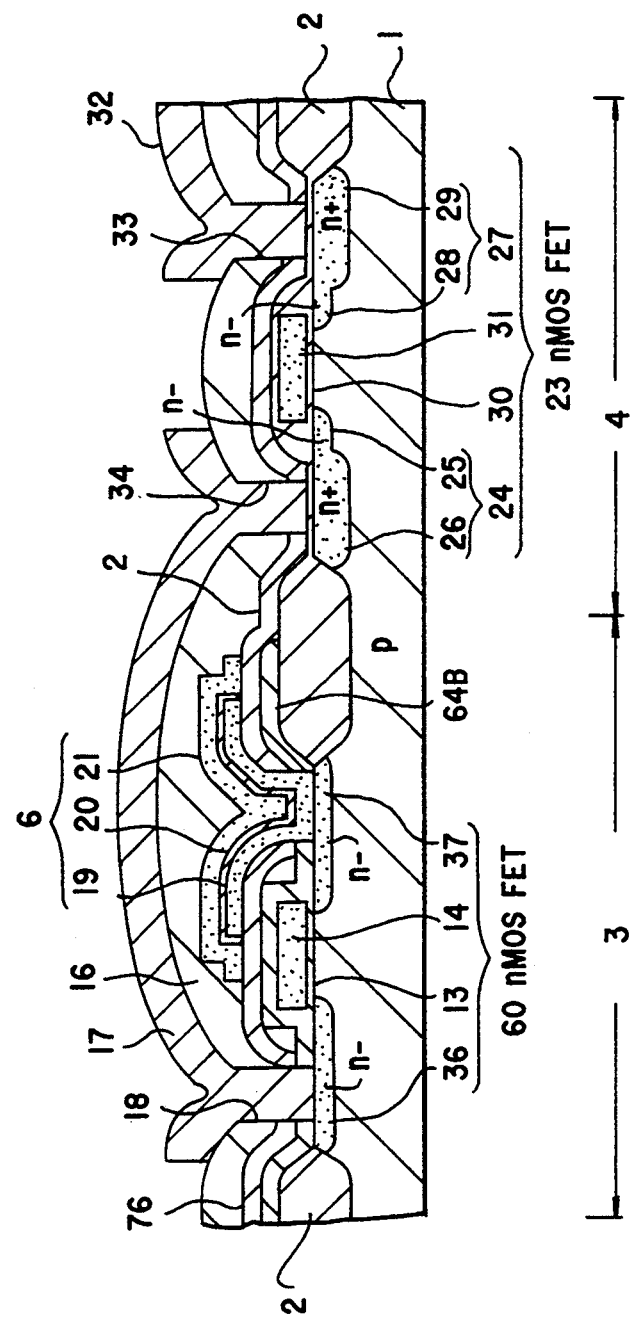

Then, this polysilicon layer 47 is patterned to form the confronting electrode 21 as shown in FIG. 7K. In addition, the PSG layer 16 is formed on the entire surface of the stacked structure to a thickness of 5000 Å, for example, as shown in FIG. 7K.

The contact holes 18, 33 and 34 are formed in the PSG layer 16 as shown in FIG. 7K, and the bit line 17 and the other interconnection 32 are formed. As a result, the second embodiment of the DRAM having the stacked capacitor 6 is obtained.

In this embodiment, the side wall SiO$_2$ layers 68, 69 and 70 are formed at the side wall portions of the part 64B of the SiO$_2$ layer 64 provided below the storage electrode 19 as shown in FIG. 7F, so as to flatten the vertical stepped portion of the side wall portions. Thereafter when the polysilicon layer 46 is etched to form the storage electrode 19, it is possible to prevent the polysilicon from remaining at the side wall portion of the part 64B as shown in FIGS. 7H and 7I. As a result, it is possible to positively prevent the mutually adjacent storage electrodes 19 from being short-circuited by a remaining polysilicon piece, and the formation of the storage electrode 19 is facilitated.

In addition, according to this embodiment, the surface of the $n^-$-type drain diffusion layer 37 to which the storage electrode 19 connects is covered by the part 64B of the $SiO_2$ layer 64 as shown in FIG. 7D. Hence, the surface of the $n^-$-type drain diffusion layer 37 will not be subjected to the plasma atmosphere when the $SiO_2$ layer 67 is etched as may be understood from FIGS. 7E and 7F. For this reason, the surface of the $n^-$-type drain diffusion layer 37 is positively protected from metal contamination. Furthermore, as shown in FIG. 7F, the side wall $SiO_2$ layer 69 above the $n^-$-type drain diffusion layer 37 is formed via the part 64B of the $SiO_2$ layer 64. Hence, the stress at the tip end of the part 64B with respect to the p-type Si substrate 1 is reduced. Moreover, since the drain diffusion layer of the nMOS FET 60 is formed only from the $n^-$-type drain diffusion layer 37 and no ion implantation of impurity needs to be made to form an $n^+$-type drain diffusion layer, it is possible to prevent the generation of crystal defect such as the dislocation loop and the edge dislocation which occur during a recrystallization process after the ion implantation of the impurity at a high dosage. Accordingly, the charge storage characteristic of the memory cell 3 can be improved.

In addition, in this embodiment, the nMOS FET 23 which forms the peripheral circuit has the LDD structure and is provided with the $n^+$-type source diffusion layer 26 and the $n^+$-type drain diffusion layer 29. Thus, the resistances of the source diffusion layer 24 and the drain diffusion layer 27 can be made small. Therefore, it is possible to ensure a sufficient current driving capability as a transistor of the peripheral circuit 4.

In other words, it is possible to simultaneously achieve three goals. First, it is possible to facilitate the formation of the storage electrode 19 by flattening the vertical stepped portion of the part 64B of the $SiO_2$ layer 64 which is formed below the storage electrode 19. Second, it is possible to improve the charge storage characteristic of the memory cell 3 by suppressing the generation of crystal defect in the $n^-$-type drain diffusion layer 37 of the nMOS FET 60 to which $n^-$-type drain diffusion layer 37 the storage electrode 19 connects. Third, it is possible to ensure a sufficient current driving capability for the nMOS FET 23 which forms the peripheral circuit 4 by reducing the resistances of the source diffusion layer 24 and the drain diffusion layer 27 of the nMOS FET 23.

In this embodiment, a first transistor forms the memory cell and a second transistor forms the peripheral circuit. However, the first transistor may form a sense amplifier of the semiconductor device.

In the described embodiments, the present invention is applied to the DRAM having stacked capacitors. However, the present invention is similarly applicable to other semiconductor devices such as a static RAM.

Further, the present invention is not limited to these embodiments, but various variations and modifications may be made without departing from the scope of the present invention.

What is claimed is:

1. A method of producing a semiconductor device comprising the steps of:
   forming a first gate of a first transistor and a second gate of a second transistor on a semiconductor substrate which has a field oxide layer for isolating said first and second transistors;
   forming impurity diffusion regions in said semiconductor substrate to make a first source diffusion region and a first drain diffusion region of said first transistor and a second source diffusion region and a second drain diffusion region of said second transistor;
   forming a first insulator layer which covers a surface of said semiconductor substrate including a surface of a region formed by said first transistor but excluding a surface of a region formed by said second transistor; and
   forming a second insulator layer which covers said first insulator layer and the surface of said second transistor; and
   forming a side wall insulation layer at a side wall portion of said first insulator layer and a side wall portion of said second gate electrode of said second transistor by carrying out an anisotropic etching with respect to said second insulator layer; and
   wherein said side wall portion of said second insulator layer remains up to a final stage of the process of producing the semiconductor device.

2. The method as claimed in claim 1 wherein said second transistor has a lightly doped drain (LDD) structure.

3. The method as claimed in claim 1 wherein said semiconductor substrate is of a first conductivity type, said step of forming the impurity diffusion regions dopes said first and second source diffusion regions and said first and second drain regions of said first and second transistors to a second conductivity type with a first dosage, said first and second conductivity types being different conductivity types.

4. The method as claimed in claim 3 which further comprises the step of doping a portion of each of said second source diffusion region and said second drain diffusion region of said second transistor to the second conductivity type with a second dosage, said first dosage being lower than said second dosage.

5. The method as claimed in claim 4 wherein said step of doping implants impurity ions into said second source diffusion region and said second drain diffusion region of said second transistor using at least said second gate and said side wall portion of said second gate as a mask.

6. The method as claimed in claim 4 wherein said first and second conductivity types respectively are p-type and n-type semiconductors, and said first and second transistors are n-channel insulated-gate field effect transistors.

7. The method as claimed in claim 1 wherein said first transistor forms a memory cell of a semiconductor memory device and said second transistor forms a peripheral circuit of the semiconductor memory device.

8. The method as claimed in claim 7 which further comprises the steps of forming a contact hole in said first insulator layer, and forming a stacked capacitor on said first insulator layer, said stacked capacitor having a storage electrode which makes contact with said first drain diffusion region via said contact hole to form the memory cell of the semiconductor memory device.

9. The method as claimed in claim 1 wherein said first and second insulator layers are made of a material selected from a group consisting of silicon dioxide ($SiO_2$).

* * * * *